(12) United States Patent
Ting et al.

(10) Patent No.: US 11,508,719 B2
(45) Date of Patent: Nov. 22, 2022

(54) ELECTROSTATIC DISCHARGE CIRCUIT

(71) Applicant: eMemory Technology Inc., Hsin-Chu (TW)

(72) Inventors: Yun-Jen Ting, Hsinchu County (TW); Chih-Wei Lai, Hsinchu County (TW); Yi-Han Wu, Hsinchu County (TW); Kun-Hsin Lin, Hsinchu County (TW); Hsin-Kun Hsu, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 94 days.

(21) Appl. No.: 16/808,564

(22) Filed: Mar. 4, 2020

(65) Prior Publication Data
US 2020/0365578 A1 Nov. 19, 2020

Related U.S. Application Data

(60) Provisional application No. 62/847,246, filed on May 13, 2019.

(51) Int. Cl.
*H01L 27/02* (2006.01)
*H01L 21/28* (2006.01)
(Continued)

(52) U.S. Cl.
CPC ...... *H01L 27/0274* (2013.01); *G11C 16/0433* (2013.01); *G11C 16/10* (2013.01); *G11C 16/14* (2013.01); *G11C 16/26* (2013.01); *H01L 23/60* (2013.01); *H01L 23/62* (2013.01); *H01L 27/0248* (2013.01); *H01L 27/0251* (2013.01);
(Continued)

(58) Field of Classification Search
CPC ............ H01L 27/0274; H01L 27/0285; H01L 27/0251; H01L 27/0266; H01L 23/62; H01L 27/0248; H01L 23/60; H01L 29/456; H01L 29/66825; H01L 29/788; H01L 27/0255; H01L 27/0288; H02H 9/046; H02M 1/14; H02M 3/07; G11C 16/30; G11C 16/0433; G11C 16/14
See application file for complete search history.

(56) References Cited

U.S. PATENT DOCUMENTS

2009/0072315 A1\* 3/2009 Hodel ................ H01L 27/0814
257/356
2011/0310514 A1\* 12/2011 Huang ................ H01L 27/027
361/56

(Continued)

*Primary Examiner* — S M Sohel Imtiaz
(74) *Attorney, Agent, or Firm* — WPAT, PC

(57) ABSTRACT

An ESD circuit is connected between an I/O pad and a first node. The ESD circuit includes a bi-directional buck circuit, a triggering circuit and a discharging circuit. The bi-directional buck circuit includes a forward path and a reverse path. The forward path and the reverse path are connected between the I/O pad and a second node. The triggering circuit is connected between the second node and the first node. The discharging circuit is connected between the second node and the first node, and connected with the triggering circuit. When the I/O pad receives negative ESD zap, the ESD current flows from the first node to the I/O pad through the discharging circuit and the reverse path. When the I/O pad receives positive ESD zap, the ESD current flows from the I/O pad to the first node through the forward path and the discharging circuit.

14 Claims, 8 Drawing Sheets

(51) Int. Cl.
*G11C 16/04* (2006.01)
*G11C 16/10* (2006.01)
*G11C 16/14* (2006.01)
*G11C 16/26* (2006.01)
*H01L 29/45* (2006.01)
*H01L 29/66* (2006.01)
*H01L 29/788* (2006.01)
*H02M 1/14* (2006.01)
*H02M 3/07* (2006.01)
*H01L 23/60* (2006.01)
*H01L 23/62* (2006.01)
*H02H 9/04* (2006.01)

(52) U.S. Cl.
CPC ...... *H01L 27/0255* (2013.01); *H01L 27/0266* (2013.01); *H01L 27/0285* (2013.01); *H01L 27/0288* (2013.01); *H01L 29/40114* (2019.08); *H01L 29/456* (2013.01); *H01L 29/66825* (2013.01); *H01L 29/788* (2013.01); *H02H 9/046* (2013.01); *H02M 1/14* (2013.01); *H02M 3/07* (2013.01)

(56) References Cited

U.S. PATENT DOCUMENTS

| | | | |
|---|---|---|---|
| 2012/0236447 A1* | 9/2012 | Mack | H02H 9/046 361/56 |
| 2015/0311700 A1* | 10/2015 | Lee | H02H 9/04 361/56 |
| 2016/0218503 A1* | 7/2016 | La Rosa | H01L 27/0255 |
| 2018/0102642 A1* | 4/2018 | Ting | H04L 9/3278 |
| 2019/0081037 A1* | 3/2019 | Abessolo Bidzo | H01L 27/0288 |
| 2019/0237967 A1* | 8/2019 | Knoedgen | H02H 9/046 |

* cited by examiner

ELECTROSTATIC DISCHARGE CIRCUIT

This application claims the benefit of U.S. provisional application Ser. No. 62/847,246, filed May 13, 2019, the subject matter of which is incorporated herein by reference.

FIELD OF THE INVENTION

The present invention relates to a circuit, and more particularly to an electrostatic discharge (ESD) circuit.

BACKGROUND OF THE INVENTION

For increasing the operating speed and integration level of integrated circuits, the sizes of the semiconductor components are gradually decreased. For example, as the size of a CMOS IC is gradually decreased, the gate oxide layer becomes thinner and thinner. Consequently, the breakage voltage of the gate oxide layer is decreased, and the breakage voltage at the PN junction of the semiconductor component is also decreased.

As known, during the manufacturing process of the integrated circuit, an ESD zapping effect may lead to damage of the integrated circuit. For avoiding the ESD zapping effect, the integrated circuit is usually equipped with an ESD circuit. The ESD circuit provides an ESD current path. Since the ESD current flows through the ESD current path, the internal circuit of the integrated circuit is not damaged by the ESD current.

SUMMARY OF THE INVENTION

An embodiment of the present invention provides an ESD circuit. The ESD circuit is connected between an I/O pad and a first node. The ESD circuit includes a bi-directional buck circuit, a triggering circuit and a discharging circuit. The bi-directional buck circuit includes a forward path and a reverse path. The forward path is connected between the I/O pad and a second node. The reverse path is connected between the I/O pad and the second node. The triggering circuit is connected between the second node and the first node. The discharging circuit is connected between the second node and the first node, and connected with the triggering circuit. When the I/O pad receives a negative ESD zap, an ESD current flows from the first node to the I/O pad through the discharging circuit and the reverse path. When the I/O pad receives a positive ESD zap, the ESD current flows from the I/O pad to the first node through the forward path and the discharging circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

During a program cycle of a non-volatile memory, a program voltage is provided to the non-volatile memory to program the memory cells of the non-volatile memory. Similarly, during an erase cycle of the non-volatile memory, an erase voltage is provided to the non-volatile memory to erase the memory cells of the non-volatile memory.

Generally, the program voltage or the erase voltage exceeds the withstanding voltage of the semiconductor component. That is, the program voltage or the erase voltage exceeds the breakage voltage of the gate oxide layer or exceeds the breakage voltage at the PN junction of the semiconductor component. As mentioned above, if the voltage received by the semiconductor component of the ESD circuit exceeds the breakage voltage, the semiconductor component is damaged. For protecting the semiconductor component, the ESD circuit should be specially designed.

Figure 1:
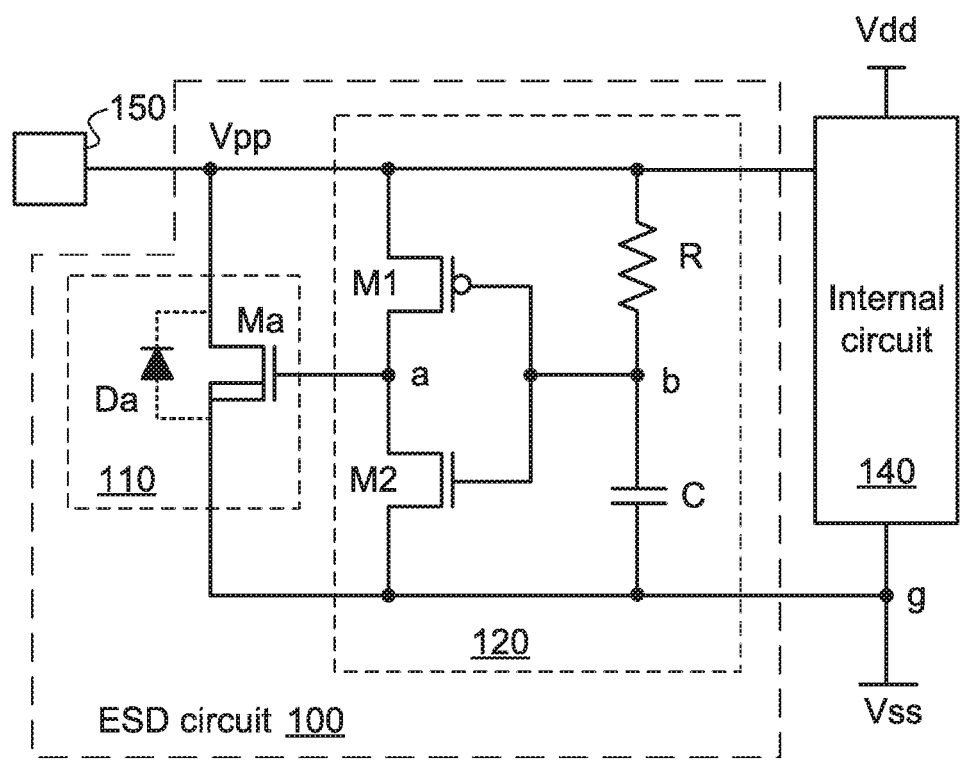
FIG. 1 is a schematic circuit diagram illustrating an ESD circuit according to a first embodiment of the present invention.

FIG. 1 is a schematic circuit diagram illustrating an ESD circuit according to a first embodiment of the present invention. The ESD circuit 100 is connected with an internal circuit 140, an input/output pad (I/O pad) 150 and a node g. The internal circuit 140 receives a supply voltage Vdd and the internal circuit 140 is connected with the node g. The I/O pad 150 receives a first voltage Vpp. The node g receives a second voltage Vss. The first voltage Vpp is transmitted to the ESD circuit 100 and the internal circuit 140 through the I/O pad 150. The second voltage Vss is transmitted to the ESD circuit 100 and the internal circuit 140 through the node g. For example, the second voltage Vss is a ground voltage.

In this embodiment, the ESD circuit 100 comprises a discharging circuit 110 and a triggering circuit 120.

The triggering circuit 120 comprises a first transistor M1, a second transistor M2, a resistor R and a capacitor C. A first terminal of the first transistor M1 is connected with the I/O pad 150. A second terminal of the first transistor M1 is connected with a node a. A control terminal of the first transistor M1 is connected with a node b. A first terminal of the second transistor M2 is connected with the node a. A second terminal of the second transistor M2 is connected with the node g. A control terminal of the second transistor M2 is connected with the node b. A first terminal of the resistor R is connected with the I/O pad 150. A second terminal of the resistor R is connected with the node b. A first terminal of the capacitor C is connected with the node b. A second terminal of the capacitor C is connected with the node g.

The discharging circuit 110 comprises a main transistor Ma. A first terminal of the main transistor Ma is connected with the I/O pad 150. A second terminal of the main transistor Ma and a body terminal of the main transistor Ma are connected with the node g. A control terminal of the main transistor Ma is connected with the node a of the triggering circuit 120. The main transistor Ma has an internal parasitic diode Da. A cathode terminal of the parasitic diode Da is connected with the first terminal of the main transistor Ma. An anode terminal of the parasitic diode Da is connected with the body terminal of the main transistor Ma.

In this embodiment, the ESD circuit 100 comprises a first ESD current discharge path and a second ESD current discharge path. The first ESD current discharge path is defined by the second terminal of the main transistor Ma, the parasitic diode Da and the first terminal of the main transistor Ma collaboratively. The second ESD current discharge path is defined by the first terminal of the main transistor Ma, a channel region of the main transistor Ma and the second terminal of the main transistor Ma. The on/off state of the second ESD current discharge path is controlled by the triggering circuit 120.

When the internal circuit 140 is in the normal working state in response to the first voltage Vpp, the ESD zap is not received by the ESD circuit 100. For example, the magnitude of the first voltage Vpp is +6V. Under this circumstance, the parasitic diode Da is reversely biased. Consequently, the first ESD current discharge path is turned off.

Moreover, the voltage at the node b of the triggering circuit 120 is equal to the first voltage Vpp. Since the control terminal of the second transistor M2 receives the first voltage Vpp, the second transistor M2 is turned on. Moreover, since the control terminal of the main transistor Ma receives the second voltage Vss, the main transistor Ma is turned off. Under this circumstance, the second ESD current discharge path is turned off.

In other words, when the I/O pad 150 receives the first voltage Vpp (e.g., +6V), it means that the ESD circuit 100 does not receive the ESD zap. Meanwhile, both of the the first ESD current discharge path and the second ESD current discharge path of the ESD circuit 100 are turned off, and the internal circuit 140 is in the normal working state in response to the first voltage Vpp.

Figure 2A:
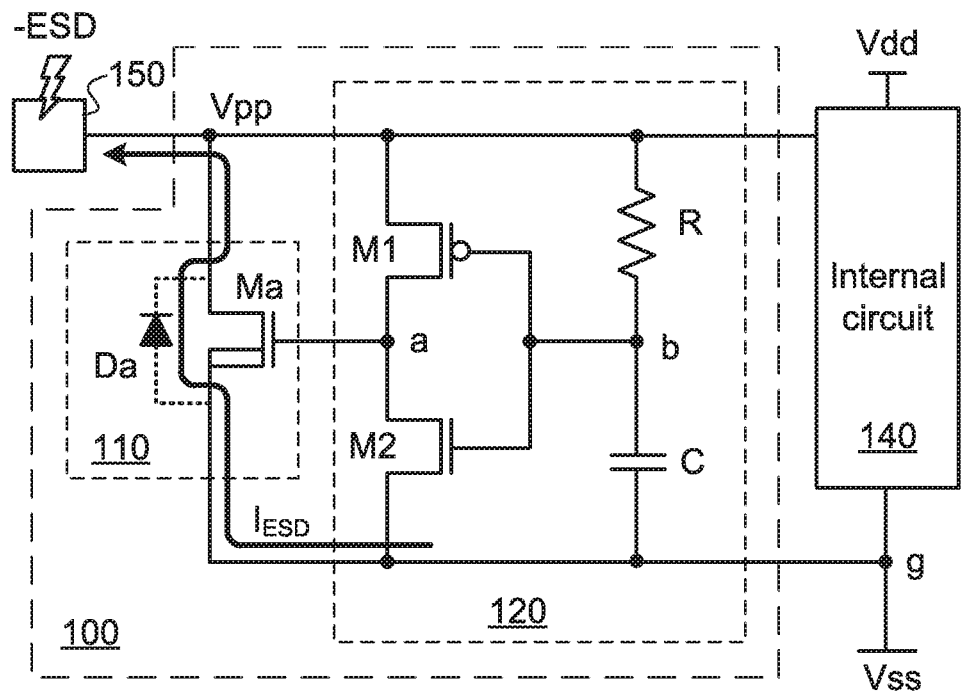
FIG. 2A is a schematic circuit diagram illustrating the operations of the ESD circuit of the first embodiment when receiving the negative ESD zap.

FIG. 2A is a schematic circuit diagram illustrating the operations of the ESD circuit of the first embodiment when receiving the negative ESD zap. When the I/O pad 150 receives the negative ESD zap, the parasitic diode Da is forwardly biased. Meanwhile, the first ESD current discharge path is turned on. Consequently, the ESD current $I_{ESD}$ flows from the node g to the I/O pad 150 through the parasitic diode Da.

Figure 2B:
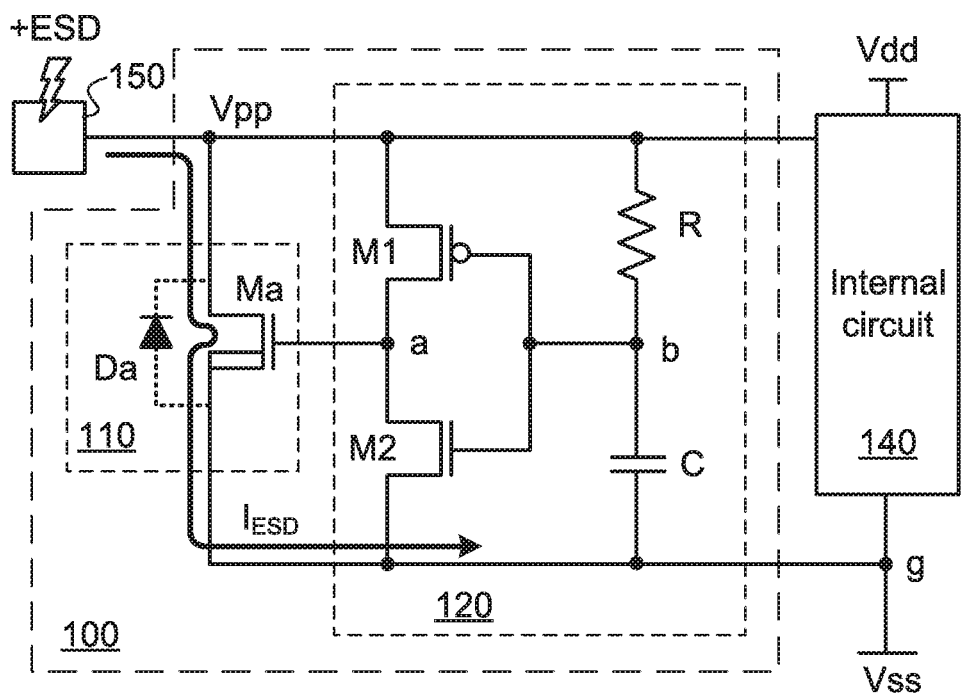
FIG. 2B is a schematic circuit diagram illustrating the operations of the ESD circuit of the first embodiment when receiving the positive ESD zap.

FIG. 2B is a schematic circuit diagram illustrating the operations of the ESD circuit of the first embodiment when receiving the positive ESD zap. When the I/O pad 150 receives the positive ESD zap, the first voltage Vpp increases quickly and the capacitor C is temporarily in a short-circuited condition. Consequently, the control terminal of the first transistor M1 receives the second voltage Vss. Meanwhile, the first transistor M1 is turned on. Moreover, since the main transistor Ma receives the first voltage Vpp, the second ESD current discharge path is turned on. In other words, when the I/O pad 150 receives the positive ESD zap, the triggering circuit 120 turns on the second ESD current discharge path. Consequently, the ESD current $I_{ESD}$ flows from the I/O pad 150 to the node g through the main transistor Ma.

From the above descriptions, the ESD current $I_{ESD}$ flows through the discharging circuit 110 when the I/O pad 150 receives the ESD zap. Since the ESD current $I_{ESD}$ does not flow through the internal circuit 140, the internal circuit 140 can be protected by the ESD circuit 100.

According to the specifications of the CMOS IC manufacturing process, the 3.3V or 5V semiconductor components can overdrive 7V. In case that the main transistor Ma, the first transistor M1 and the second transistor M2 are 3.3V transistors or 5V transistors, the main transistor Ma, the first transistor M1 and the second transistor M2 overdriving 7V can be operated normally. That is, the breakage voltage of the gate oxide layer of the semiconductor component or the breakage voltage at the PN junction of the semiconductor component exceeds 7V. That is, if the first voltage Vpp is +6V, the ESD circuit 100 with the 3.3V transistors or 5V transistors can be operated normally and the internal circuit 140 can be protected by the ESD circuit 100.

In case that the main transistor Ma, the first transistor M1 and the second transistor M2 are 1.8V semiconductor components, the main transistor Ma, the breakage voltage of the gate oxide layer of the semiconductor component or the breakage voltage at the PN junction of the semiconductor component is only 4V. Since the first voltage Vpp is +6V, the 1.8V transistors will be damaged and the ESD circuit 100 with the 1.8V transistors cannot be operated normally.

Figure 3:
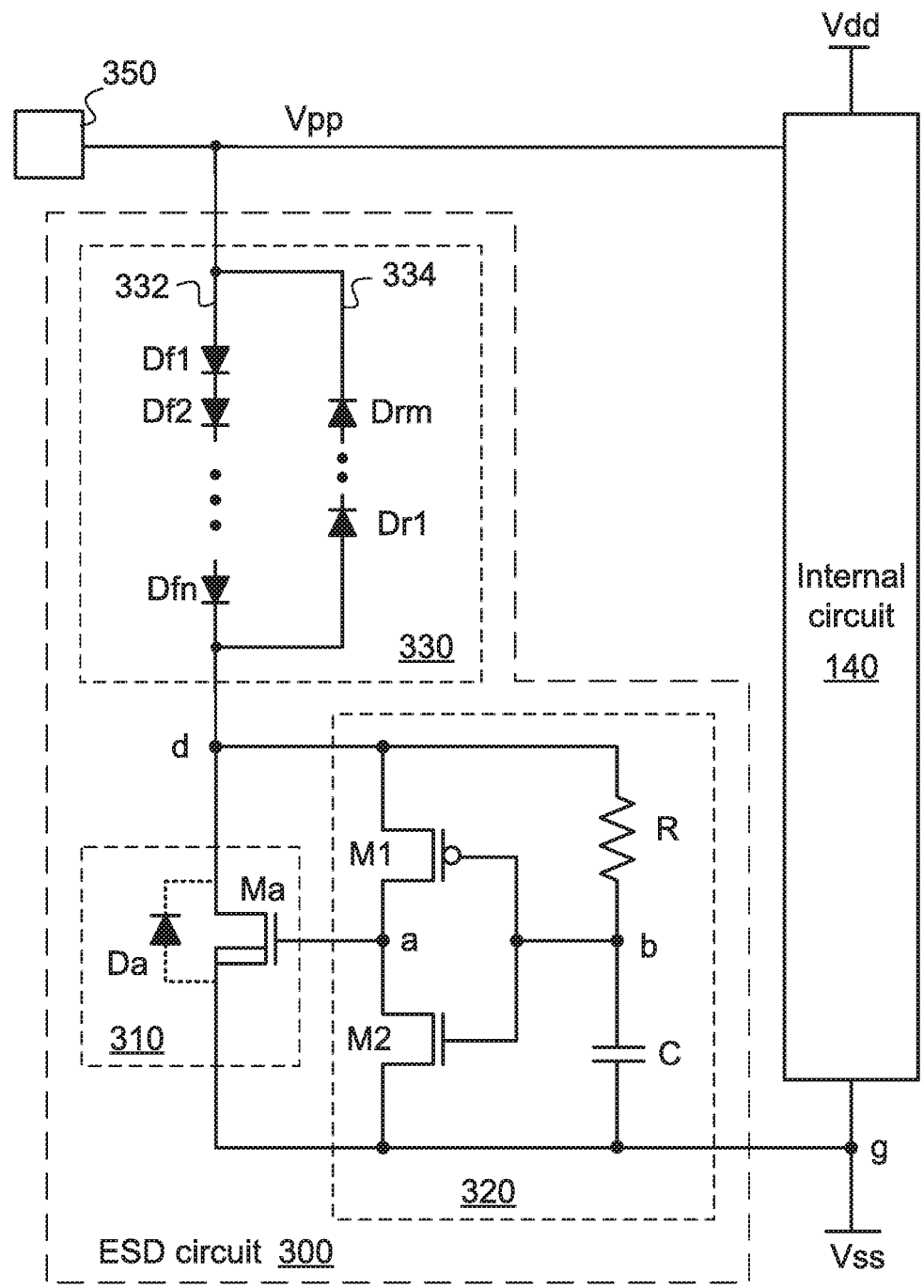
FIG. 3 is a schematic circuit diagram illustrating an ESD circuit according to a second embodiment of the present invention.

FIG. 3 is a schematic circuit diagram illustrating an ESD circuit according to a second embodiment of the present invention. The ESD circuit 300 is connected with an internal circuit 140, an I/O pad 350 and a node g. The internal circuit 140 receives a supply voltage Vdd and the internal circuit 140 is connected with the node g. The I/O pad 350 receives a first voltage Vpp. The node g receives a second voltage Vss. The first voltage Vpp is transmitted to the ESD circuit 100 and the internal circuit 140 through the I/O pad 350. The second voltage Vss is transmitted to the ESD circuit 300 and the internal circuit 140 through the node g. For example, the second voltage Vss is a ground voltage.

In this embodiment, the ESD circuit 300 comprises a discharging circuit 310, a triggering circuit 320 and a bi-directional buck circuit 330. Moreover, the semiconductor components of the ESD circuit 300 are 1.8V semiconductor components.

The triggering circuit 320 comprises a first transistor M1, a second transistor M2, a resistor R and a capacitor C. A first terminal of the first transistor M1 is connected with a node d. A second terminal of the first transistor M1 is connected with a node a. A control terminal of the first transistor M1 is connected with a node b. A first terminal of the second transistor M2 is connected with the node a. A second terminal of the second transistor M2 is connected with the node g. A control terminal of the second transistor M2 is connected with the node b. A first terminal of the resistor R is connected with the node d. A second terminal of the resistor R is connected with the node b. A first terminal of the capacitor C is connected with the node b. A second terminal of the capacitor C is connected with the node g.

The discharging circuit 310 comprises a main transistor Ma. A first terminal of the main transistor Ma is connected with the node d. A second terminal of the main transistor Ma and a body terminal of the main transistor Ma are connected with the node g. A control terminal of the main transistor Ma is connected with the node a of the triggering circuit 320. The main transistor Ma has an internal parasitic diode Da. A cathode terminal of the parasitic diode Da is connected with the first terminal of the main transistor Ma. An anode terminal of the parasitic diode Da is connected with the body terminal of the main transistor Ma.

The bi-directional buck circuit 330 comprises a forward path 332 and a reverse path 334. The forward path 332 comprises n diodes Df1~Dfn, which are serially connected between the I/O pad 350 and the node d. The reverse path 334 comprises m diodes Dr1~Drm, which are serially connected between the I/O pad 350 and the node d. Moreover, m and n are positive integers.

In case that the magnitude of the first voltage Vpp is higher than voltage at the node d, the n diodes Df1~Dfn of the forward path 332 are forwardly biased and the m diodes Dr1~Drm of the reverse path 334 are reversely biased. The turn-on threshold voltage of the forward path 332 can be expressed as n×Von, wherein Von is a cut-in voltage of the diode. For example, the cut-in voltage Von is 0.7V.

In this embodiment, the ESD circuit 300 comprises a first ESD current discharge path and a second ESD current discharge path. The first ESD current discharge path is defined by the second terminal of the main transistor Ma, the parasitic diode Da, the first terminal of the main transistor Ma and the reverse path 334 collaboratively. The second ESD current discharge path is defined by the forward path 332, the first terminal of the main transistor Ma, a channel region of the main transistor Ma and the second terminal of the main transistor Ma. The on/off state of the second ESD current discharge path is controlled by the triggering circuit 320.

For designing the ESD circuit 300, the magnitude of the first voltage Vpp has to be lower than the sum of the turn-on threshold voltage n×Von of the forward path 332 and the breakage voltage Vbd of the semiconductor component. That is, Vpp<(n×Von+Vbd). For example, if the magnitude of the first voltage Vpp is +6V and the breakage voltage Vbd of the semiconductor component is +4V, the number n of the diodes in the forward path 332 is larger than or equal to 3. In case that n=3, (n×Von+Vbd)=(3×0.7V+4V)=+6.1V, which is higher than the magnitude of the first voltage Vpp. Consequently, the ESD circuit 300 can be operated normally.

When the ESD circuit 300 is in the normal working state, the m diodes of the reverse path 334 have to withstand the reverse voltage with the magnitude of (n×Von). For example, in case that the forward path 332 comprises three diodes (i.e., n=3), one diode of the reverse path 334 (i.e., m=1) can withstand the reverse voltage of 2.1V. The operations of the ESD circuit 300 will be described as follows. In the following example, n=3 and m=1. It is noted that the values of n and m are not restricted.

When the internal circuit 140 is in the normal working state in response to the first voltage Vpp, the ESD zap is not received by the ESD circuit 300. For example, the magnitude of the first voltage Vpp is +6V. Under this circumstance, the reverse path 334 and the parasitic diode Da are reversely biased. Consequently, the first ESD current discharge path is turned off.

Moreover, the voltage at the node b of the triggering circuit 320 is about +4.9V (i.e., Vpp−3×0.7V=+4.9V). Consequently, the second transistor M2 is turned on. Moreover, since the control terminal of the main transistor Ma receives the second voltage Vss, the main transistor Ma is turned off. Under this circumstance, the second ESD current discharge path is turned off.

In other words, when the I/O pad 350 receives the first voltage Vpp (e.g., +6V), it means that the ESD circuit 300 does not receive the ESD zap. Meanwhile, both of the the first ESD current discharge path and the second ESD current discharge path of the ESD circuit 300 are turned off, and the internal circuit 140 is in the normal working state in response to the first voltage Vpp.

Figure 4A:
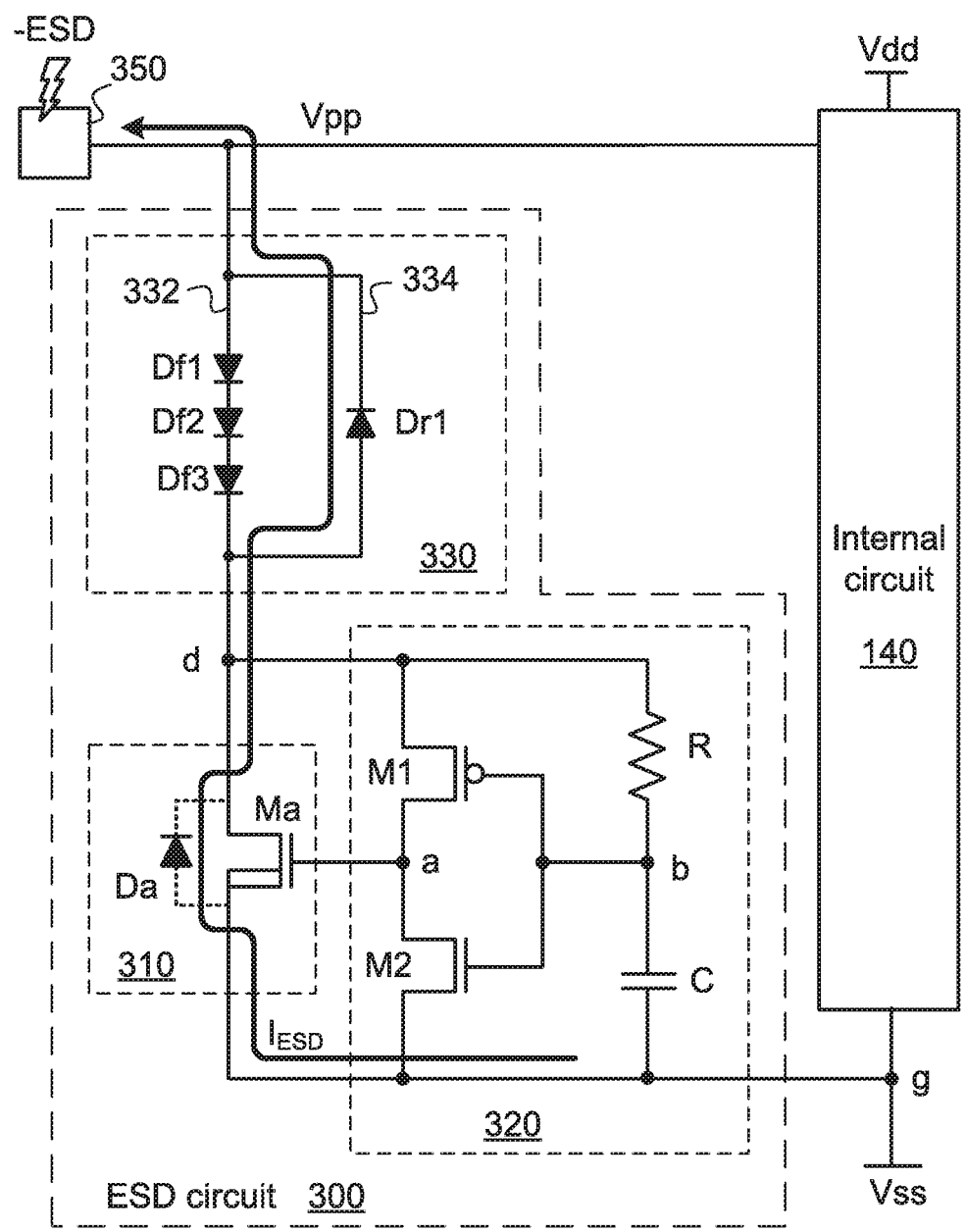
FIG. 4A is a schematic circuit diagram illustrating the operations of the ESD circuit of the second embodiment when receiving the negative ESD zap.

FIG. 4A is a schematic circuit diagram illustrating the operations of the ESD circuit of the second embodiment when receiving the negative ESD zap. When the I/O pad 350 receives the negative ESD zap, the parasitic diode Da and the reverse path 334 are forwardly biased. Meanwhile, the first ESD current discharge path is turned on. Consequently, the ESD current $I_{ESD}$ flows from the node g to the I/O pad 350 through the parasitic diode Da and the reverse path 334.

Figure 4B:
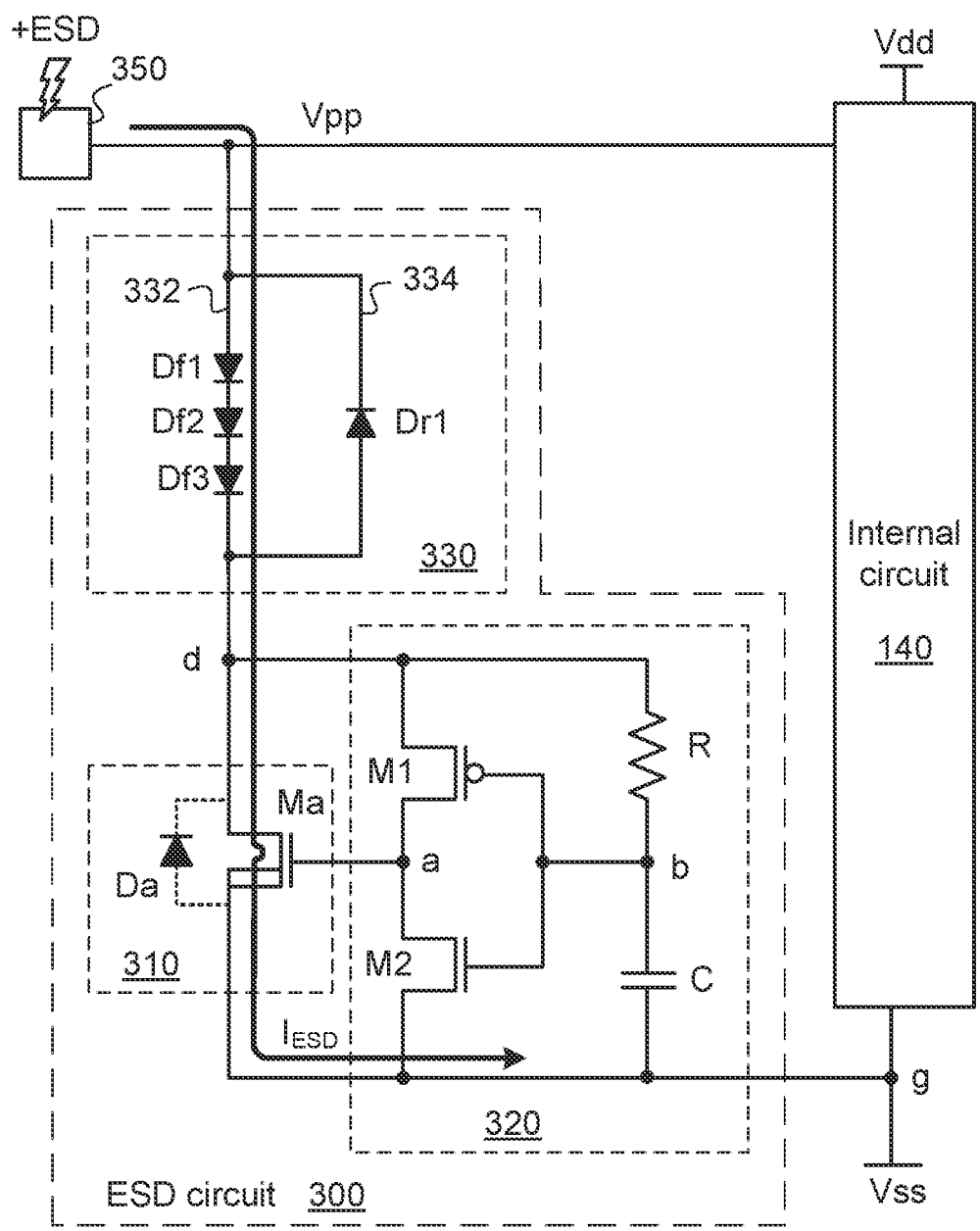
FIG. 4B is a schematic circuit diagram illustrating the operations of the ESD circuit of the second embodiment when receiving the positive ESD zap.

FIG. 4B is a schematic circuit diagram illustrating the operations of the ESD circuit of the second embodiment when receiving the positive ESD zap. When the I/O pad 350 receives the positive ESD zap, the first voltage Vpp increases quickly and the capacitor C is temporarily in a short-circuited condition. Consequently, the control terminal of the first transistor M1 receives the second voltage Vss. Meanwhile, the first transistor M1 is turned on. Moreover, since the control terminal of the main transistor Ma receives the first voltage Vpp, the second ESD current discharge path is turned on. In other words, when the I/O pad 350 receives the positive ESD zap, the triggering circuit 320 turns on the second ESD current discharge path. Consequently, the ESD current $I_{ESD}$ flows from the I/O pad 350 to the node g through the forward path 332 and the main transistor Ma.

From the above descriptions, the ESD current $I_{ESD}$ flows through the bi-directional buck circuit 330 and the discharging circuit 310 when the I/O pad 350 receives the ESD zap. Since the ESD current $I_{ESD}$ does not flow through the internal circuit 140, the internal circuit 140 can be protected by the ESD circuit 300. When the I/O pad 350 receives the negative ESD zap, the ESD current $I_{ESD}$ flows from the node g to the I/O pad 350 through the discharging circuit 310 and the reverse path 334. When the I/O pad 350 receives the positive ESD zap, the ESD current $I_{ESD}$ flows from the I/O pad 350 to the node g through the forward path 332 and the discharging circuit 310.

In the ESD circuit 300 of the second embodiment, the main transistor Ma of the discharging circuit 310 is an n-type transistor. It is noted that the triggering circuit may be modified. For example, in another embodiment, the main transistor Ma of the discharging circuit 310 is a p-type transistor. Some other examples of the ESD circuit will be described as follows.

Figure 5:
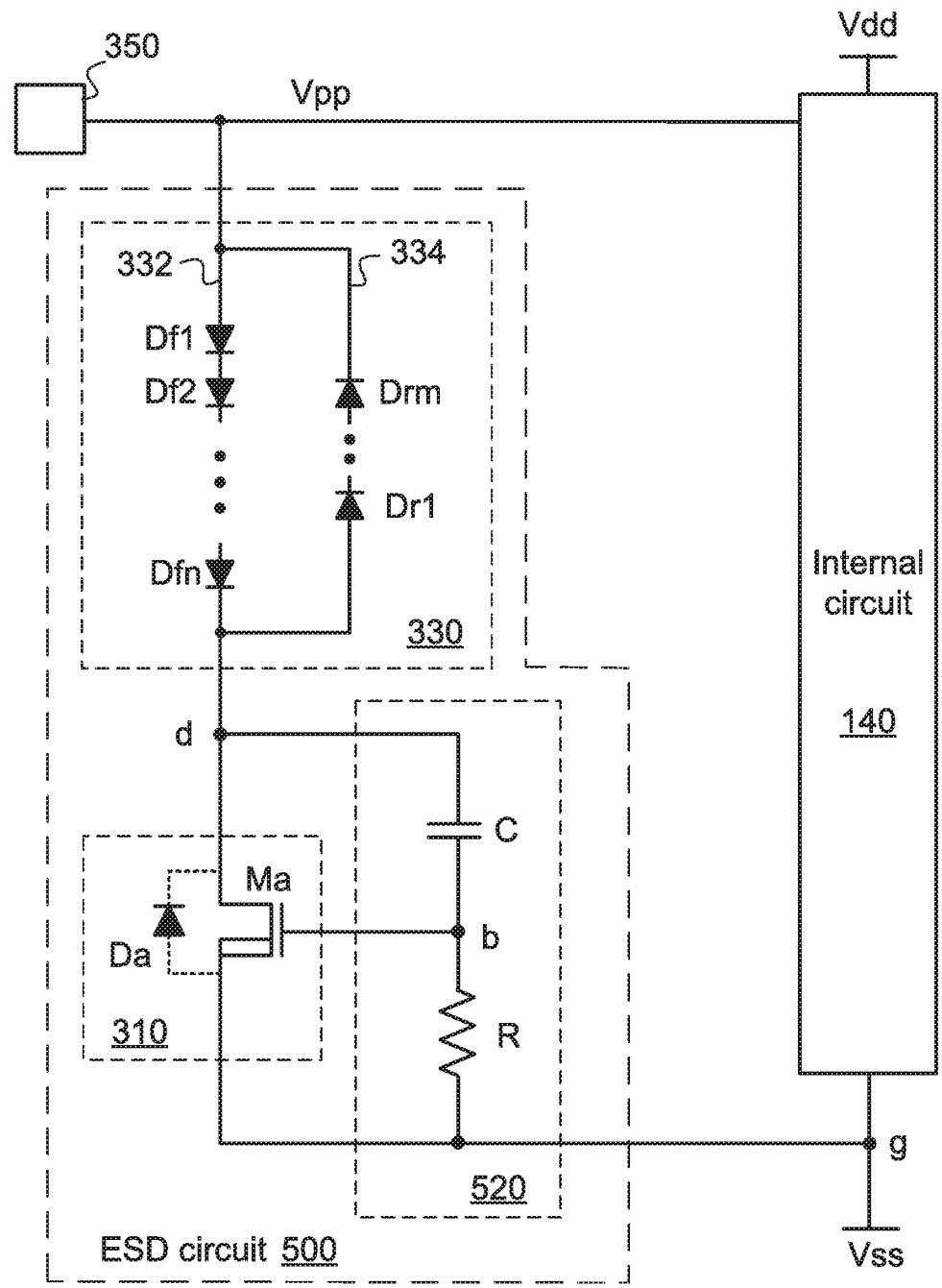
FIG. 5 is a schematic circuit diagram illustrating an ESD circuit according to a third embodiment of the present invention.

FIG. 5 is a schematic circuit diagram illustrating an ESD circuit according to a third embodiment of the present invention. In this embodiment, the ESD circuit 500 comprises a discharging circuit 310, a triggering circuit 520 and a bi-directional buck circuit 330. In comparison with the second embodiment, the triggering circuit 520 is distinguished. The discharging circuit 310 and the bi-directional buck circuit 330 of this embodiment are similar to those of the second embodiment, and are not redundantly described herein.

The triggering circuit 520 of the ESD circuit 500 comprises a resistor R and a capacitor C. A first terminal of the resistor R is connected with the node b. A second terminal of the resistor R is connected with the node g. A first terminal of the capacitor C is connected with the node d. A second terminal of the capacitor C is connected with the node b.

When the internal circuit 140 is in the normal working state in response to the first voltage Vpp, the ESD zap is not received by the ESD circuit 500. Since the node b of the triggering circuit 520 receives the second voltage Vss, the main transistor Ma is turned off. Under this circumstance, the second ESD current discharge path is turned off.

When the I/O pad 350 receives the positive ESD zap, the first voltage Vpp increases quickly and the capacitor C is temporarily in a short-circuited condition. Since the control terminal of the main transistor Ma receives the first voltage Vpp, the second ESD current discharge path is turned on. In other words, when the I/O pad 350 receives the ESD zap, the internal circuit 140 can be protected by the ESD circuit 500.

In the ESD circuit 500 of the third embodiment, a parasitic capacitor is formed between the first terminal of the main transistor Ma and the control terminal of the main transistor Ma. It is noted that the ESD circuit 500 of the third embodiment may be further modified. For example, in another embodiment, the capacitor C of the triggering circuit is omitted. That is, the triggering circuit comprises a resistor R. The resistor R is connected between the node b and the node g. The ESD circuit can be operated normally.

Figure 6:
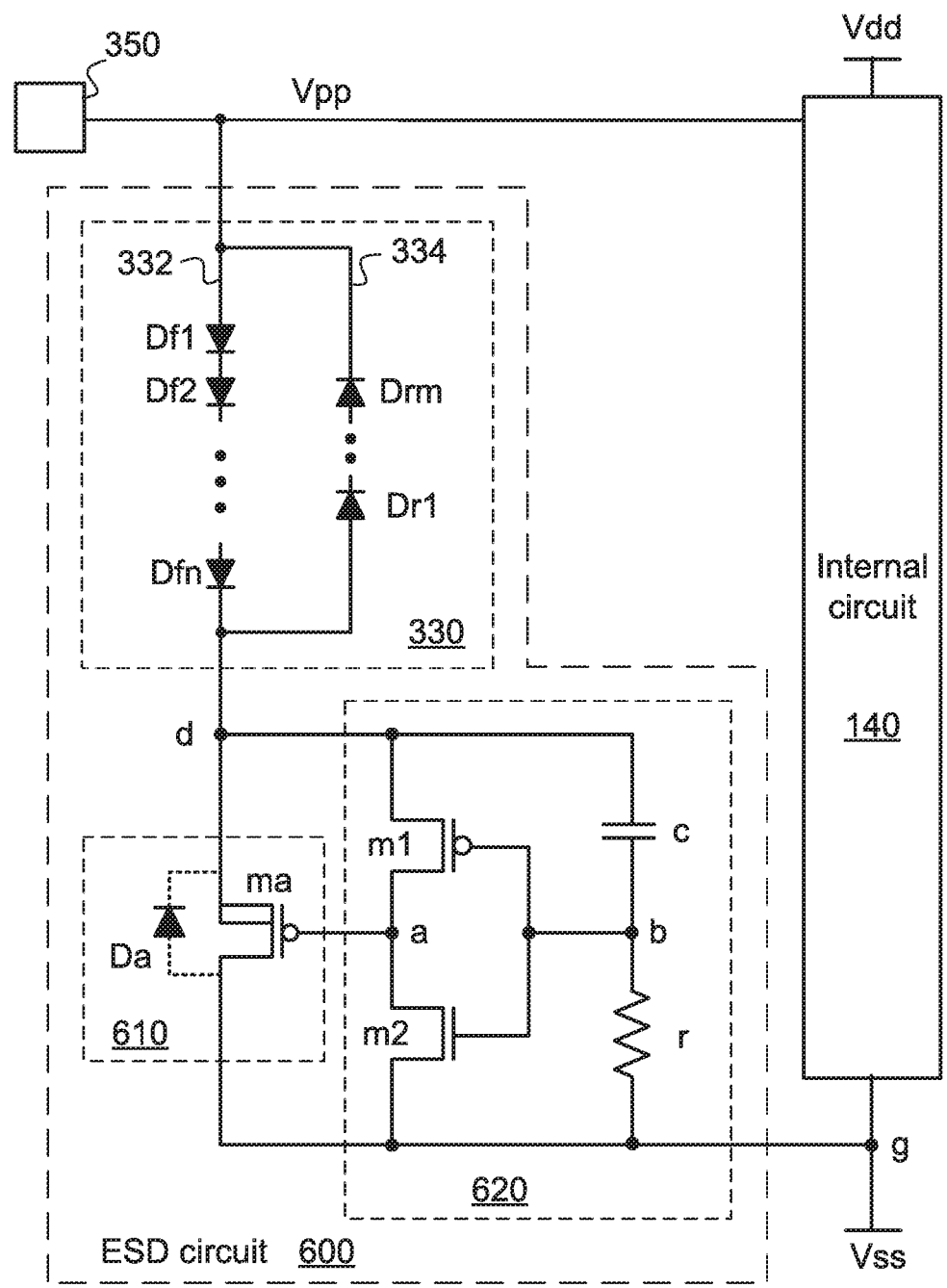
FIG. 6 is a schematic circuit diagram illustrating an ESD circuit according to a fourth embodiment of the present invention.

FIG. 6 is a schematic circuit diagram illustrating an ESD circuit according to a fourth embodiment of the present invention. In this embodiment, the ESD circuit 600 comprises a discharging circuit 610, a triggering circuit 620 and a bi-directional buck circuit 330.

The triggering circuit 620 comprises a first transistor m1, a second transistor m2, a resistor r and a capacitor c. A first terminal of the first transistor m1 is connected with a node d. A second terminal of the first transistor m1 is connected with a node a. A control terminal of the first transistor m1 is connected with a node b. A first terminal of the second transistor m2 is connected with the node a. A second terminal of the second transistor m2 is connected with the node g. A control terminal of the second transistor m2 is connected with the node b. A first terminal of the resistor r is connected with the node b. A second terminal of the resistor r is connected with the node g. A first terminal of the capacitor c is connected with the node d. A second terminal of the capacitor c is connected with the node b.

The discharging circuit 610 comprises a main transistor ma. The main transistor ma is a p-type transistor. A first terminal of the main transistor ma and a body terminal of the main transistor ma are connected with the node d. A second terminal of the main transistor ma is connected with the node g. A control terminal of the main transistor ma is connected with the node a of the triggering circuit 620. The main transistor ma has an internal parasitic diode Da. A cathode terminal of the parasitic diode Da is connected with the body terminal of the main transistor ma. An anode terminal of the parasitic diode Da is connected with the second terminal of the main transistor ma.

The circuitry of the bi-directional buck circuit 330 is similar to that of the second embodiment, and is not redundantly described herein.

In this embodiment, the ESD circuit 600 comprises a first ESD current discharge path and a second ESD current discharge path. The first ESD current discharge path is defined by the second terminal of the main transistor ma, the parasitic diode Da, the first terminal of the main transistor ma and the reverse path 334 collaboratively. The second ESD current discharge path is defined by the forward path 332, the first terminal of the main transistor ma, a channel region of the main transistor ma and the second terminal of the main transistor ma. The on/off state of the second ESD current discharge path is controlled by the triggering circuit 620.

When the internal circuit 140 is in the normal working state in response to the first voltage Vpp, the ESD zap is not received by the ESD circuit 600. Under this circumstance, the reverse path 334 and the parasitic diode Da are reversely biased. Consequently, the first ESD current discharge path is turned off.

Moreover, since the node b of the triggering circuit 620 receives the second voltage Vss, the main transistor ma is turned off. Under this circumstance, the second ESD current discharge path is turned off.

In other words, when the ESD circuit 600 does not receive the ESD zap, both of the the first ESD current discharge path and the second ESD current discharge path of the ESD circuit 600 are turned off. Consequently, the internal circuit 140 is in the normal working state in response to the first voltage Vpp.

When the I/O pad 350 receives the negative ESD zap, the parasitic diode Da and the reverse path 334 are forwardly biased. Meanwhile, the first ESD current discharge path is turned on. Consequently, the ESD current $I_{ESD}$ flows from the node g to the I/O pad 350 through the parasitic diode Da and the reverse path 334.

When the I/O pad 350 receives the positive ESD zap, the first voltage Vpp increases quickly and the capacitor c is temporarily in a short-circuited condition. Since the control terminal of the second transistor m2 receives the first voltage Vpp, the second transistor m2 is turned on. Moreover, since the control terminal of the main transistor ma receives the second voltage Vss, the second ESD current discharge path is turned on. In other words, when the I/O pad 350 receives the positive ESD zap, the triggering circuit 620 turns on the second ESD current discharge path. Consequently, the ESD current $I_{ESD}$ flows from the I/O pad 350 to the node g through the forward path 332 and the main transistor ma.

From the above descriptions, the ESD current $I_{ESD}$ flows through the bi-directional buck circuit 330 and the discharging circuit 610 when the I/O pad 350 receives the ESD zap. Since the ESD current $I_{ESD}$ does not flow through the internal circuit 140, the internal circuit 140 can be protected by the ESD circuit 600.

Figure 7:
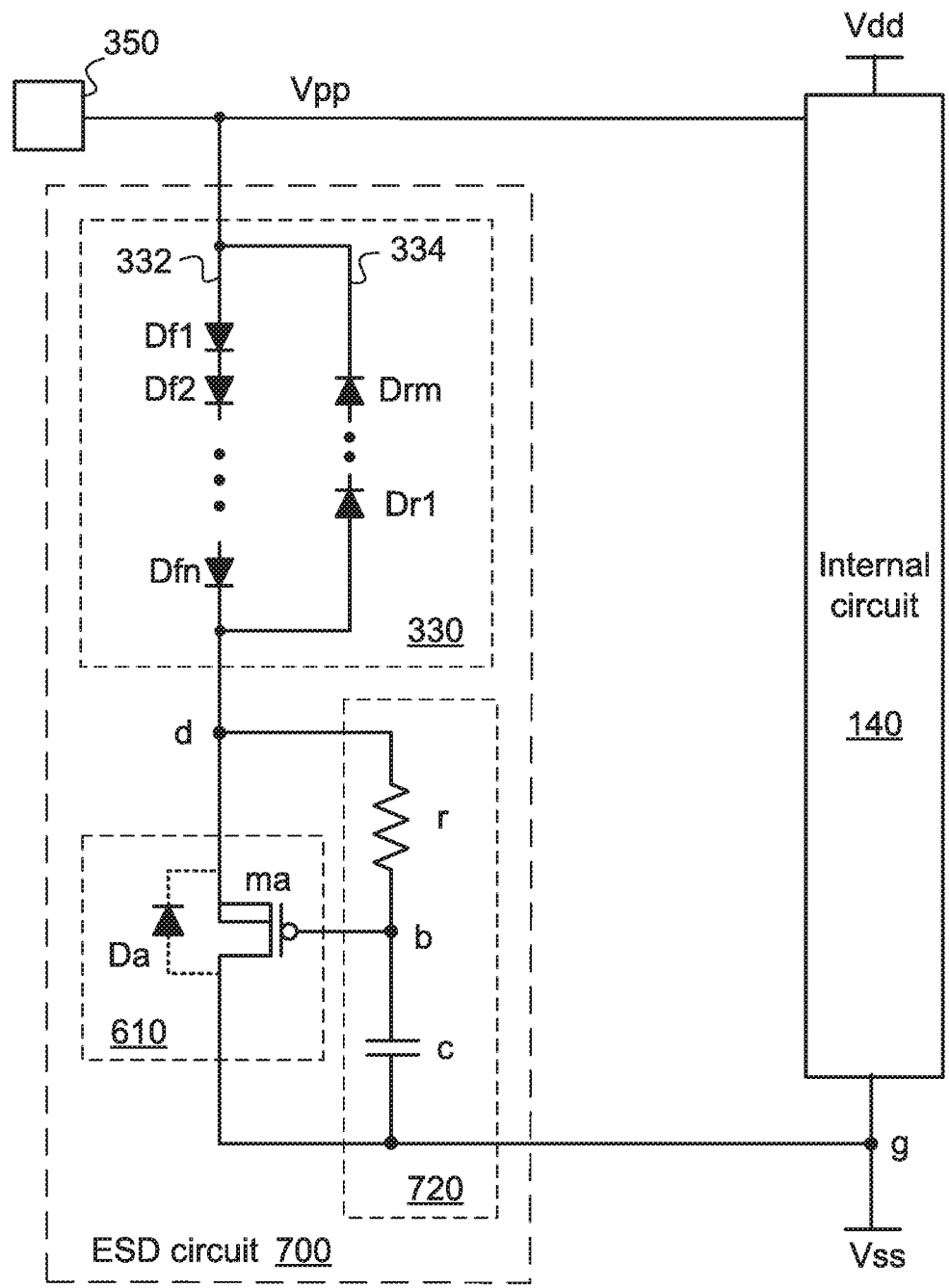
FIG. 7 is a schematic circuit diagram illustrating an ESD circuit according to a fifth embodiment of the present invention.

FIG. 7 is a schematic circuit diagram illustrating an ESD circuit according to a fifth embodiment of the present invention. In this embodiment, the ESD circuit 700 comprises a discharging circuit 610, a triggering circuit 720 and a bi-directional buck circuit 330. In comparison with the fourth embodiment, the triggering circuit 720 is distinguished. The discharging circuit 610 and the bi-directional buck circuit 330 of this embodiment are similar to those of the second embodiment, and are not redundantly described herein.

The triggering circuit 720 of the ESD circuit 700 comprises a resistor r and a capacitor c. A first terminal of the resistor r is connected with the node d. A second terminal of the resistor r is connected with the node b. A first terminal of the capacitor c is connected with the node b. A second terminal of the capacitor c is connected with the node g.

When the internal circuit 140 is in the normal working state in response to the first voltage Vpp, the ESD zap is not received by the ESD circuit 700. Since the voltages at the node b and the node d of the triggering circuit 720 are equal, the main transistor ma is turned off. Under this circumstance, the second ESD current discharge path is turned off.

When the I/O pad 350 receives the positive ESD zap, the first voltage Vpp increases quickly and the capacitor c is temporarily in a short-circuited condition. Since the control terminal of the main transistor ma receives the second voltage Vss, the main transistor ma is turned on. Consequently, the second ESD current discharge path is turned on. In other words, when the I/O pad 350 receives the ESD zap, the internal circuit 140 can be protected by the ESD circuit 700.

In the ESD circuit 700 of the fifth embodiment, a parasitic capacitor is formed between the first terminal of the main transistor ma and the control terminal of the main transistor ma. It is noted that the ESD circuit 700 of the third embodiment may be further modified. For example, in another embodiment, the capacitor c of the triggering circuit is omitted. That is, the triggering circuit comprises a resistor r. The resistor r is connected between the node b and the node g. The ESD circuit can be operated normally.

From the above descriptions, the present invention provides the ESD circuit. The semiconductor components of the ESD circuit are low-operation-voltage semiconductor components. For example, the semiconductor components are 1.8V transistors. When the I/O pad 350 does not receive the positive ESD zap, the withstanding voltage of the semiconductor component in the ESD circuit is lower than the breakage voltage of the gate oxide layer of the semiconductor component or the breakage voltage at the PN junction of the semiconductor component. Consequently, the ESD circuit can be operated normally.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrostatic discharge (ESD) circuit connected between an I/O pad and a first node, the ESD circuit comprising:
    a bi-directional buck circuit comprising a forward path and a reverse path, wherein the forward path includes a plurality of diodes serially connected between the I/O pad and a second node, and the reverse path includes at least one diode connected between the I/O pad and the second node, wherein if a voltage of the I/O pad is higher than a voltage of the second node, the diodes of the forward path are forwardly biased and the at least one diode of the reverse path is reversely biased;
    a triggering circuit connected between the second node and the first node; and
    a discharging circuit directly connected with the second node, connected with the first node, and connected with the triggering circuit,
    wherein when the I/O pad receives a negative ESD zap, the reverse path is forwardly biased and an ESD current flows from the first node to the I/O pad through the discharging circuit and the reverse path,
    wherein when the I/O pad receives a positive ESD zap, the forward path is forwardly biased and the ESD current flows from the I/O pad to the first node through the forward path and the discharging circuit.

2. The ESD circuit as claimed in claim 1, wherein the discharging circuit comprises a main transistor, wherein a first terminal of the main transistor is directly connected with the second node, a second terminal of the main transistor and a body terminal of the main transistor are connected with the first node, a control terminal of the main transistor is connected with the triggering circuit, the main transistor has a parasitic diode, a cathode terminal of the parasitic diode is connected with the first terminal of the main transistor, and an anode terminal of the parasitic diode is connected with the body terminal of the main transistor.

3. The ESD circuit as claimed in claim 2, wherein the main transistor is an n-type transistor.

4. The ESD circuit as claimed in claim 2, wherein the triggering circuit comprises:
    a first transistor, wherein a first terminal of the first transistor is directly connected with the second node, a second terminal of the first transistor is connected with a third node, and a control terminal of the first transistor is connected with a fourth node;
    a second transistor, wherein a first terminal of the second transistor is connected with the third node, a second terminal of the second transistor is connected with the first node, and a control terminal of the second transistor is connected with the fourth node;
    a resistor, wherein a first terminal of the resistor is connected with the second node, and a second terminal of the resistor is connected with the fourth node; and
    a capacitor, wherein a first terminal of the capacitor is connected with the fourth node, and a second terminal of the capacitor is connected with the first node,
    wherein the third node is connected with the control terminal of the main transistor.

5. The ESD circuit as claimed in claim 2, wherein the triggering circuit comprises:
    a capacitor, wherein a first terminal of the capacitor is connected with the second node, and a second terminal of the capacitor is connected with a third node; and
    a resistor, wherein a first terminal of the resistor is connected with the third node, and a second terminal of the resistor is connected with the first node,
    wherein the third node is connected with the control terminal of the main transistor.

6. The ESD circuit as claimed in claim 2, wherein the triggering circuit comprises a resistor, wherein a first terminal of the resistor is connected with the control terminal of the main transistor, and a second terminal of the resistor is connected with the first node.

7. The ESD circuit as claimed in claim 2, wherein when the I/O pad receives the negative ESD zap, the ESD current flows from the first node to the I/O pad through the parasitic diode of the main transistor and the reverse path, wherein when the I/O pad receives the positive ESD zap, the ESD current flows from the I/O pad to the first node through the forward path and a channel region of the main transistor.

8. The ESD circuit as claimed in claim 1, wherein the discharging circuit comprises a main transistor, wherein a first terminal of the main transistor and a body terminal of the main transistor are connected with the second node, a second terminal of the main transistor are connected with the first node, a control terminal of the main transistor is connected with the triggering circuit, the main transistor has a parasitic diode, a cathode terminal of the parasitic diode is connected with the body terminal of the main transistor, and an anode terminal of the parasitic diode is connected with the second terminal of the main transistor.

9. The ESD circuit as claimed in claim 8, wherein the main transistor is a p-type transistor.

10. The ESD circuit as claimed in claim 8, wherein the triggering circuit comprises:
    a first transistor, wherein a first terminal of the first transistor is connected with the second node, a second terminal of the first transistor is connected with a third node, and a control terminal of the first transistor is connected with a fourth node;

a second transistor, wherein a first terminal of the second transistor is connected with the third node, a second terminal of the second transistor is connected with the first node, and a control terminal of the second transistor is connected with the fourth node;

a resistor, wherein a first terminal of the resistor is connected with the fourth node, and a second terminal of the resistor is connected with the first node; and a capacitor, wherein a first terminal of the capacitor is connected with the second node, and a second terminal of the capacitor is connected with the fourth node, wherein the third node is connected with the control terminal of the main transistor.

11. The ESD circuit as claimed in claim 8, wherein the triggering circuit comprises:

a resistor, wherein a first terminal of the resistor is connected with the second node, and a second terminal of the resistor is connected with a third node; and a capacitor, wherein a first terminal of the capacitor is connected with the third node, and a second terminal of the capacitor is connected with the first node, wherein the third node is connected with the control terminal of the main transistor.

12. The ESD circuit as claimed in claim 8, wherein the triggering circuit comprises a resistor, wherein a first terminal of the resistor is connected with the second node, and a second terminal of the resistor is connected with the control terminal of the main transistor.

13. The ESD circuit as claimed in claim 8, wherein when the I/O pad receives the negative ESD zap, the ESD current flows from the first node to the I/O pad through the parasitic diode of the main transistor and the reverse path, wherein when the I/O pad receives the positive ESD zap, the ESD current flows from the I/O pad to the first node through the forward path and a channel region of the main transistor.

14. An electrostatic discharge (ESD) circuit connected between an I/O pad and a first node, the ESD circuit comprising:

a bi-directional buck circuit comprising a forward path and a reverse path, wherein the forward path comprises n diodes serially connected between the I/O pad and a second node, and the reverse path comprises m diodes connected between the I/O pad and the second node, m and n are positive integers;

a triggering circuit connected between the second node and the first node; and a discharging circuit directly connected with the second node, connected with the first node, and connected with the triggering circuit, wherein when the I/O pad receives a negative ESD zap, an ESD current flows from the first node to the I/O pad through the discharging circuit and the reverse path, wherein when the I/O pad receives a positive ESD zap, the ESD current flows from the I/O pad to the first node through the forward path and the discharging circuit, wherein an internal circuit is connected between the I/O pad and the first node; in the normal working state of the internal circuit, a magnitude of the voltage of the I/O pad is lower than a sum of a turn-on threshold voltage of the forward path and a breakage voltage of a semiconductor component; the turn-on threshold voltage is equal to n times a cut-in voltage of one diode; and the breakage voltage is a breakage voltage of a gate oxide layer of the semiconductor component or a breakage voltage at a PN junction of the semiconductor component.

* * * * *